(12) United States Patent
Caron et al.

(10) Patent No.: US 11,626,842 B2
(45) Date of Patent: Apr. 11, 2023

(54) TUNABLE VECTOR RECOMBINATION AMPLIFIER

(71) Applicant: SKYWORKS SOLUTIONS, INC., Irvine, CA (US)

(72) Inventors: Joshua James Caron, Madison, NC (US); Roman Zbigniew Arkiszewski, Oak Ridge, NC (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 303 days.

(21) Appl. No.: 17/121,904

(22) Filed: Dec. 15, 2020

(65) Prior Publication Data

US 2022/0190790 A1 Jun. 16, 2022

(51) Int. Cl.
| | | |
|---|---|---|
| *H03F 1/56* | (2006.01) | |
| *H03F 3/24* | (2006.01) | |
| *H04B 1/3827* | (2015.01) | |

(52) U.S. Cl.
CPC ............... *H03F 1/56* (2013.01); *H03F 3/245* (2013.01); *H04B 1/3827* (2013.01); *H03F 2200/222* (2013.01); *H03F 2200/387* (2013.01); *H03F 2200/451* (2013.01)

(58) Field of Classification Search
CPC ...... H03F 1/56; H03F 3/245; H03F 2200/222; H03F 2200/387; H03F 2200/451; H04B 1/3827
USPC .......................................................... 330/295
See application file for complete search history.

(56) References Cited

U.S. PATENT DOCUMENTS

| | | | |
|---|---|---|---|
| 8,653,890 B1* | 2/2014 | Ahmed | H03F 3/195 330/124 R |
| 2008/0298509 A1* | 12/2008 | Sorrells | H03F 1/02 375/322 |

OTHER PUBLICATIONS

Huttunen et al., "A 20-W Chireix Outphasing Transmitter for WCDMA Base Stations", IEEE 2007 MTTS Symposium Proceedings. (Year: 2007).*

* cited by examiner

*Primary Examiner* — Hafizur Rahman
(74) *Attorney, Agent, or Firm* — Lando & Anastasi, LLP

(57) ABSTRACT

A tunable vector recombination amplifier comprises an input, an output, first and second amplifier circuit paths each including a respective phase shifter to receive a respective input signal from the input and to apply a respective phase shift to produce a respective phase-shifted signal, a respective interstage impedance matching network, and a respective amplifier connected between the respective phase shifter and interstage impedance matching network to receive and amplify the respective phase-shifted signal to produce a respective amplified signal, first and second controllable DC voltage sources each coupled to a respective amplifier and configured to provide a respective supply voltage to the respective amplifier, values of the supply voltages being independently controllable, and an output amplifier stage to receive, amplify, and vectorially combine the amplified signals to produce a combined signal having a specified phase determined by the phase shifts and supply-voltage values and a specified amplitude at the output.

20 Claims, 6 Drawing Sheets

TUNABLE VECTOR RECOMBINATION AMPLIFIER

BACKGROUND

Many power amplifier (PA) architectures require multiple signal paths with well-controlled phase and amplitude differences between them. For example, a Doherty amplifier includes two individual power amplifiers, designated as the carrier amplifier and the peaking amplifier, with a 90° phase difference between them. Likewise, a Chireix amplifier (also known as an out-phasing amplifier) includes two separate power amplifiers paths that are 180° apart in phase. Other architectures such as the Load Insensitive Power Amplifier (LIPA) use 90° relative phase shifts between two power amplifiers to cancel out signal reflections due to load mismatch.

SUMMARY OF THE INVENTION

In all of the above examples of power amplifier architectures, and also in push-pull power amplifier designs, it is relatively straightforward to achieve the desired phase shifts at a single frequency. Over a wider bandwidth, however, such as the spectrum covered by a broadband power amplifier module in a cellular handset, maintaining the proper phase shift can be extremely difficult. Aspects and embodiments are directed to tunable vector recombination amplifiers having accurate broadband phase control and which may be used in or to replace a variety of different power amplifier configurations.

According to at least one example of the disclosure, a tunable vector recombination amplifier includes an input, an output, a first amplifier circuit path including a first phase shifter, a first interstage impedance matching network, and a first amplifier connected between the first phase shifter and the first interstage impedance matching network, the first phase shifter being configured to receive an input signal from the input and to apply a first phase shift to produce a first phase-shifted signal, and the first amplifier being configured to receive and amplify the first phase-shifted signal to produce a first amplified signal, a second amplifier circuit path including a second phase shifter, a second interstage impedance matching network, and a second amplifier connected between the second phase shifter and the second interstage impedance matching network, the second phase shifter being configured to receive the input signal from the input and to apply a second phase shift, different from the first phase shift, to produce a second phase-shifted signal, and the second amplifier being configured to receive and amplify the second phase-shifted signal to produce a second amplified signal, a first controllable DC voltage source coupled to the first amplifier and configured to provide a first supply voltage to the first amplifier, a second controllable DC voltage source coupled to the second amplifier and configured to provide a second supply voltage to the second amplifier, values of the first and second supply voltages being independently controllable, and an output amplifier stage coupled to the first and second amplifier circuit paths and to the output and configured to receive, amplify, and vectorially combine the first and second amplified signals to produce a combined output signal having a specified phase and amplitude at the output, the specified phase being determined by the first and second phase shifts and the values of the first and second supply voltages.

In some examples, the first phase shift is $\phi_0+\Delta\phi$ and the second phase shift is $\phi_0-\Delta\phi$, wherein $\phi_0$ is an average of the first and second phase shifts, and $2\Delta\phi$ is a phase difference between the first and second phase shifts. In at least one example, the first phase shift is +45 degrees and the second phase shift is −45 degrees. In various examples, the output amplifier stage includes an even plurality of transistors connected in parallel, and a first half of the even plurality of transistors receive the first amplified signal and a second half of the even plurality of transistors received the second amplified signal. In some examples, the transistors of the even plurality of transistors are bipolar junction transistors and are connected in parallel at their collectors and emitters. In at least one example, the transistors of the even plurality of transistors are field effect transistors and are connected in parallel at their drains and sources. In various examples, each of the first amplifier and the second amplifier includes a plurality of transistors connected in parallel. In some examples, the first phase shifter and the second phase shifter each include an inductive-capacitive (LC) circuit having at least one inductive element and at least one capacitive element.

In at least one example, the tunable vector recombination amplifier further includes a third amplifier circuit path including a third phase shifter, a third interstage impedance matching network, and a third amplifier connected between the third phase shifter and the third interstage impedance matching network, the third phase shifter being configured to receive the input signal from the input and to apply a third phase shift, different from the first and second phase shifts, to produce a third phase-shifted signal, and the third amplifier being configured to receive and amplify the third phase-shifted signal to produce a third amplified signal, and a third controllable DC voltage source coupled to the third amplifier and configured to provide a third supply voltage to the third amplifier, a value of the third supply voltage being controllable independent of the first and second supply voltages, wherein the output amplifier stage is further coupled to the third amplifier circuit path and configured to receive, amplify, and vectorially combine the first, second, and third amplified signals to produce the combined output signal, the specified phase of the output signal being determined by the first, second, and third phase shifts and the values of the first, second, and third supply voltages.

According to at least one example of the disclosure, a tunable vector recombination amplifier includes an input, an output, a plurality of amplifier circuit paths connected to the input, each including a first amplifier stage, a phase shifter connected to an input of the first amplifier stage, an interstage impedance matching network connected to an output of first amplifier stage, and a controllable DC voltage source connected to the first amplifier stage, each amplifier circuit path of the plurality of amplifier circuit paths configured to receive an input signal from the input and to provide a phase-shifted, amplified first-stage output signal, and a second amplifier stage coupled to the plurality of amplifier circuit paths and to the output, the second amplifier stage being configured to receive, amplify, and vectorially combined the phase-shifted, amplified first-stage output signals from the plurality of amplifier circuit paths to produce a combined output signal having a specified phase and amplitude at the output, the specified phase being determined by phase shift values applied by the phase shifter in each of the plurality of amplifier circuit paths and individually controllable voltages applied to the first amplifier stage of each of the plurality of amplifier circuit paths by the controllable DC voltage sources.

In at least one example, the plurality of amplifier circuit paths includes a first amplifier circuit path and a second amplifier circuit path, and wherein the phase shift values applied by the phase shifter in each of the first and second amplifier circuit paths are 90 degrees apart. In various examples, the plurality of amplifier circuit paths includes a first amplifier circuit path, a second amplifier circuit path, and a third amplifier circuit path, and the phase shift values applied by the phase shifter in each of the first and second amplifier circuit paths are 120 degrees apart. In some examples, the phase shifter in each of the plurality of amplifier circuit paths includes an inductive-capacitive (LC) circuit having at least one inductive element and at least one capacitive element. In at least one example, the amplifier module includes a controller coupled to the output and to the controllable DC voltage sources, the controller being configured to receive and analyze the combined output signal and to adjust the individually controllable voltages applied to the first amplifier stage of each of the plurality of amplifier circuit paths by the controllable DC voltage sources to maintain the specified phase of the combined output signal.

According to at least one example, a wireless device includes a transceiver configured to produce a transmit signal, and a power amplifier module including at least one tunable vector recombination amplifier and a plurality of individually controllable DC voltage sources, the at least one tunable vector recombination amplifier being configured to receive the transmit signal, to divide the transmit signal into at least two amplifier paths each having a different phase shift, and to amplify and vectorially recombine phase-shifted components of the transmit signal from each of the at least two amplifier paths to produce an amplified transmit signal having a specified phase and amplitude, each of the at least two amplifier paths of the at least one tunable vector recombination amplifier including a first-stage amplifier driven by one of the plurality of individually controllable DC voltage sources to tune the specified phase of the amplified transmit signal.

In various examples, the at least two amplifier paths include a first amplifier path including a first phase shifter, a first interstage impedance matching network, and a first first-stage amplifier connected between the first phase shifter and the first interstage impedance matching network, the first phase shifter being configured to receive the transmit signal and to apply a first phase shift to produce a first phase-shifted signal, and the first first-stage amplifier being configured to receive and amplify the first phase-shifted signal to produce a first amplified signal, and a second amplifier path including a second phase shifter, a second interstage impedance matching network, and a second first-stage amplifier connected between the second phase shifter and the second interstage impedance matching network, the second phase shifter being configured to receive the transmit signal and to apply a second phase shift, different from the first phase shift, to produce a second phase-shifted signal, and the second amplifier being configured to receive and amplify the second phase-shifted signal to produce a second amplified signal.

In some examples, the plurality of individually controllable DC voltage sources includes a first controllable DC voltage source coupled to the first first-stage amplifier and configured to provide a first supply voltage to the first amplifier, and a second controllable DC voltage source coupled to the second first-stage amplifier and configured to provide a second supply voltage to the second amplifier, values of the first and second supply voltages being independently controllable. In at least one example, the at least one tunable vector recombination amplifier includes an output amplifier stage coupled to the first and second amplifier paths and configured to receive, amplify, and vectorially combine the first and second amplified signals to produce the amplified transmit signal having the specified phase and amplitude, the specified phase being determined by the first and second phase shifts and the values of the first and second supply voltages.

In various examples, the first phase shift is $\phi_0 + \Delta\phi$ and the second phase shift is $\phi_0 - \Delta\phi$, wherein $\phi_0$ is an average of the first and second phase shifts, and $2\Delta\phi$ is a phase difference between the first and second phase shifts. In some examples, the first phase shift is +45 degrees and the second phase shift is −45 degrees. In at least one example, the output amplifier stage includes an even plurality of transistors connected in parallel, and a first half of the even plurality of transistors receive the first amplified signal and a second half of the even plurality of transistors received the second amplified signal. In various examples, the first phase shifter and the second phase shifter each include an inductive-capacitive (LC) circuit having at least one inductive element and at least one capacitive element.

In some examples, the wireless device further includes an electromagnetic coupler configured to receive the amplified transmit signal and to sample the amplified transmit signal via electromagnetic coupling to produce a coupled signal having characteristics representative of the amplified transmit signal. In some examples, the wireless device further includes a sensor module coupled to the power amplifier module and to the electromagnetic coupler, the sensor module being configured to receive and analyze the coupled signal, and to adjust the values of the first and second supply voltages to tune the specified phase of the amplified transmit signal. In various examples, the wireless device further includes a sensor module coupled to the electromagnetic coupler and configured to receive the coupled signal and to provide sensor information representative of at least one of the characteristics of the amplified transmit signal, and control circuitry coupled to the power amplifier module and to the sensor module, the control circuitry being configured to receive the sensor information and to adjust the values of the first and second supply voltages, based on the sensor information, to tune the specified phase of the amplified transmit signal. In at least one example, the wireless device includes an antenna to transmit the amplified transmit signal.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral.

For purposes of clarity, not every component may be labeled in every figure. In the figures.

DETAILED DESCRIPTION

As discussed above, various power amplifier (PA) architectures use multiple amplifier paths with a particular phase shift between them. Although is relatively straightforward to achieve the desired phase shifts at a single frequency, over wider bandwidths, such as the spectrum covered by a broadband power amplifier in a cellular handset, maintaining the proper phase shift can be extremely difficult. This applies to both the "splitter" at the device input where the signal is split into multiple phase-shifted paths, as well as to the "combiner" at the PA output where the amplified phase-shifted signals are subsequently recombined in phase. Real-world phasing networks, especially those designed to be very small and inexpensive, deviate significantly from the intended phase shift over a wide bandwidth. Furthermore, the insertion loss such a network presents also tends to vary over frequency. This too can be problematic for multi-path amplifier architectures because these devices usually require that the respective signal powers be identical or otherwise tightly controlled. In addition, the output combining networks that are typically included after the outputs of the amplifier stage can add significant loss, which is undesirable.

In light of the above-mentioned problems with existing phase-shifting networks, aspects and embodiments are directed to a PA architecture configured to compensate for these phase and amplitude variations. In addition, as discussed in more detail below, recombination of the phase-shifted amplifier paths is performed in the output stage of the amplifier, thereby avoiding the need for potentially very lossy output combining networks.

Figure 1:
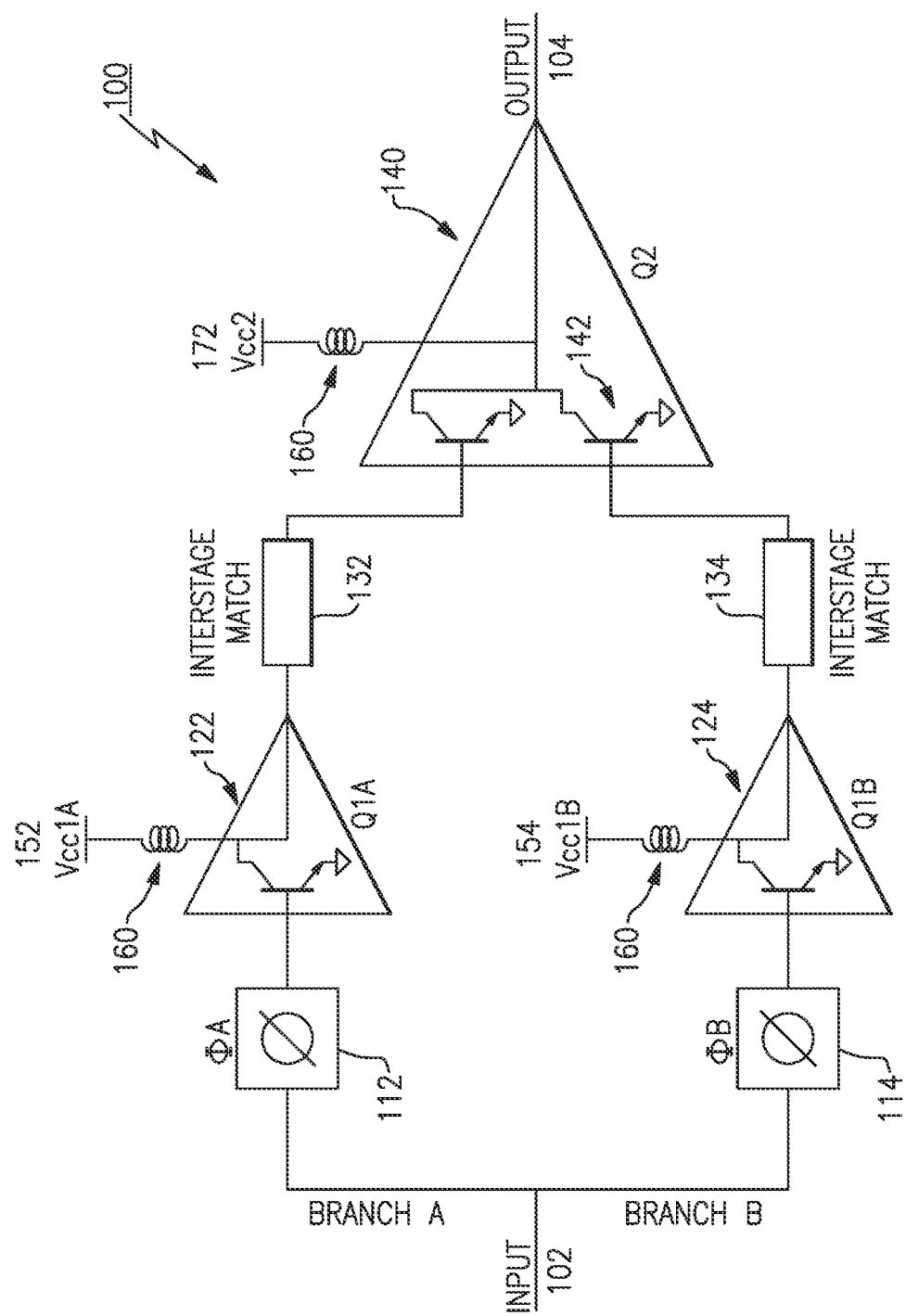
FIG. 1 is a block diagram of one example of an amplifier according to aspects of the present invention.

Referring to FIG. 1, there is illustrated a block diagram of one example of a power amplifier 100 according to certain embodiments. The input signal is provided at an input contact 102, and divided into two separate paths, branch A and branch B. Each branch or path includes a phase shifter (φA (112) and φB (114), respectively), a first amplification stage (Q1A (122) and Q1B (124), respectively), and an interstage impedance matching network 132, 134, respectively. Each of the first amplification stage 122 and the second amplification stage 124 includes one or more transistors connected in parallel. All elements are identical between the two paths except for the values of the respective phase shifters, φA (112) and φB (114). The two branches are then vectorially recombined at a second amplifier stage Q2 (140) and the output signal is provided at an output contact 104. The second amplifier stage 140 includes an even plurality of transistors 142 connected in parallel at their collectors and emitters (or drains and sources if field effect transistors (FETs) are used). The summation of the two paths is accomplished by driving half of the bases (or gates) of the second amplifier stage 140 from one branch (e.g., branch A) and the other half from the other branch (e.g., branch B). As discussed above, by performing the recombination (summation) of the two paths in the second amplifier stage, the need for an output combining network (conventionally made up of lossy inductive and capacitive elements) is avoided.

According to certain embodiments, the phase shifters 112, 114 shift the phase in each path by $\phi_0+\Delta\phi$ and $\phi_0-\Delta\phi$ respectively, where $\phi0$ is the average of the two phase shifts, and $2\Delta\phi$ is the difference between them. The value of the average phase, $\phi_0$, is irrelevant to the conceptual understanding of the techniques disclosed herein, and therefore for purposes of simplification, it can be assumed that it is zero. In this case, the two phase shifters 112, 114 shift the phase of their respective paths by $+\Delta\phi$ and $-\Delta\phi$, respectively. In certain examples, the phase shifters 112, 114 may be implemented using inductive and capacitive elements in an LC circuit. As noted above, LC circuits may be lossy; however, in examples of the amplifier 100 disclosed herein, they are used in the phase shifters 112, 114 prior to amplification, and not after amplification (as is the case for conventional output combining networks), and therefore the associated loss is less problematic as it can be compensated for by the amplification.

According to certain examples, in addition to shifting the phase, the phase shifters 112, 114 may also be used for impedance matching. The input impedance of each individual branch should be double the desired impedance at the combined power amplifier input contact 102. For example, if a 50-ohm input impedance is desired, each branch should present an input impedance of 100 ohms. The phase shifters 112, 114 may be designed not only to shift the phase appropriately, but also to transform the impedance seen looking into each branch to the desired impedance.

Still referring to FIG. 1, the collectors of the first amplifier stages 122 (Q1A) and 124 (Q1B) are driven by controllable DC voltage sources 152 (Vcc1A) and 154 (Vcc1B). The controllable DC voltage sources 152, 154 may be implemented using high-efficiency buck DC/DC converters, low drop-out (LDO) voltage regulators, or a combination of both. The second amplifier stage 140 also is driven by a voltage source 172. Each of the voltage sources 152, 154, 172 may be connected to the respective amplifier stage 122, 124, 140 via an inductive element 160 for noise suppression. By configuring the interstage matching networks 132, 134 to ensure that first amplifier stages 122, 124 operate in compression, the power out of each first amplifier stage 122, 124 can be individually controlled by raising or lowering its respective collector voltage. With the two branches differing by a predetermined phase and with independent control over the signal power generated by each branch, the amplitude and phase of the resultant vectorially summed signal at the collector of second amplifier stage 140 (Q2) can be well controlled. Varying the difference in voltage between the two branches changes the respective amount of power generated by each path and therefore modulates the phase. Scaling the voltages up or down together modulates the output amplitude when both the first amplification (Q1) stages 122, 124 are saturated. Furthermore, by varying the DC bias level on the bases of the first amplification (Q1) stages 122, 124, the dynamic range can be further extended into the linear domain.

As discussed above, embodiments of the amplifier 100 may be useful in a variety of power amplifier configurations, including push-pull amplifiers. Embodiments of the amplifier 100 may be configured to entirely replace a conventional two-stage power amplifier, or to replace one of the power amplifiers of a multi-branch architecture, such as the Doherty or Chireix examples discussed above. Alternatively, embodiments of the amplifier 100 may be configured to replace the first two stages of a power amplifier with three or more stages. This example may be particularly beneficial because in such a configuration, the first amplifier (Q1) stages 122, 124 may operate at very low power such that the variable voltage supplies would be required to deliver less current, and their efficiency may be a less important design consideration. Furthermore, operating the first amplifier (Q1) stages 122, 124 at a low voltage may also be less detrimental to the overall gain of the power amplifier if three or more stages are used. In addition, using embodiments of the amplifier 100, which can accurately produce and maintain a desired phase at the output, may eliminate or at least reduce the need for pre-distorting the input signal prior to amplification by the power amplifier, a complex technique that is often applied by baseband processing circuitry to account for non-linearities in the power amplifier stage.

Figure 2:
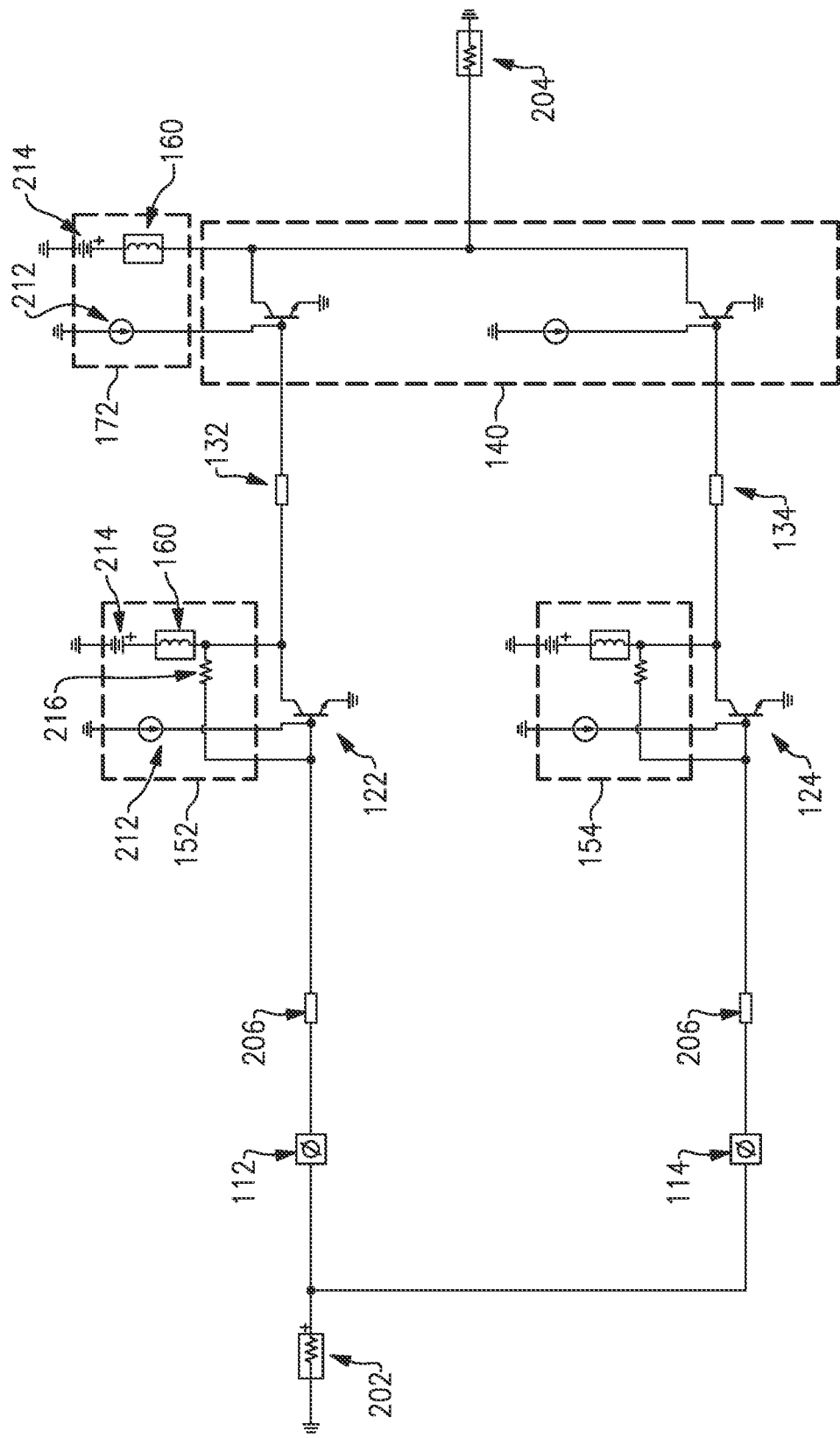
FIG. 2 is a simulation schematic for one example of the amplifier of FIG. 1.
Figure 3:
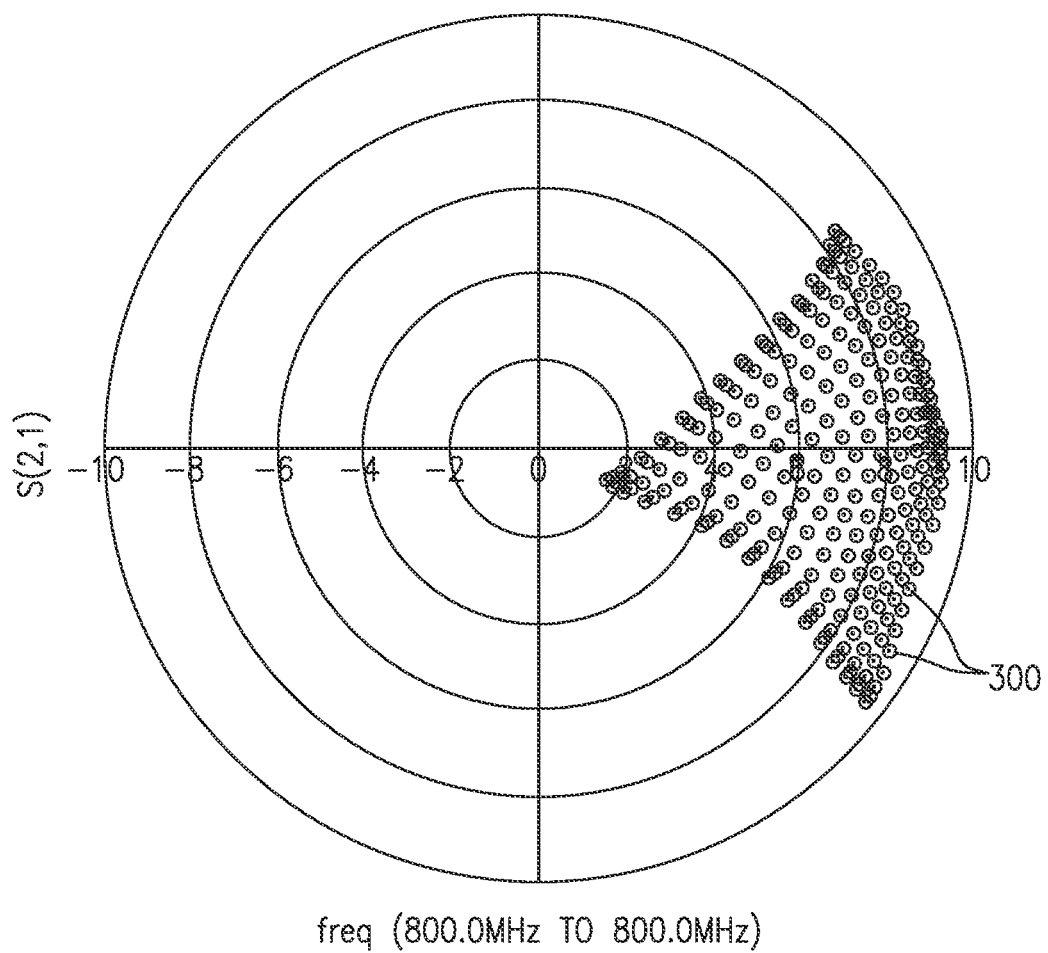
FIG. 3 is a polar diagram showing simulated resulting magnitude and phase of the output signal from the simulated amplifier of FIG. 2 for varying applied DC voltage values.

An example of the amplifier 100 has been designed and simulated using phase shifters 112, 114 of ±45°, each having an impedance of 100 ohms. FIG. 2 illustrates the simulation schematic. The example of the amplifier 100 was simulated with an input termination impedance 202 of 50 ohms at the input contact 102, and a complex output termination impedance 204 given by $Z_{out}$=complex (3.5, 1.5) ohms at the output contact 104. Each branch in the simulation circuit includes an input matching component 206. As discussed above, in practice, input impedance matching may be provided by the phase shifters 112, 114. Each of the controllable DC voltage sources 152, 154 was simulated using a current source 212, a DC voltage source 214, and a resistor 216, along with the inductive component 160. The resistor 216 had a value of 300 ohms. Similarly, the voltage source 172 for the second amplifier stage 140 was also simulated using a current source 212 and a DC voltage source 214, along with the inductive component 160. The example of the amplifier 100 was simulated at 800 MHz, sweeping the two voltage sources 214, corresponding to the first and second controllable DC voltage sources 152, 154, from 0.5V to 1.0V in 33 mV steps. The resulting magnitude and phase of the output signal are plotted in the polar diagram of FIG. 3. In FIG. 3, each dot 300 represents a different pair of voltage values for the first and second controllable DC voltage sources 152, 154. Over the above-noted voltage ranges, the phase and amplitude of the simulated output varied over a dynamic range of close to 90° and 8 dB, respectively.

Figure 4:
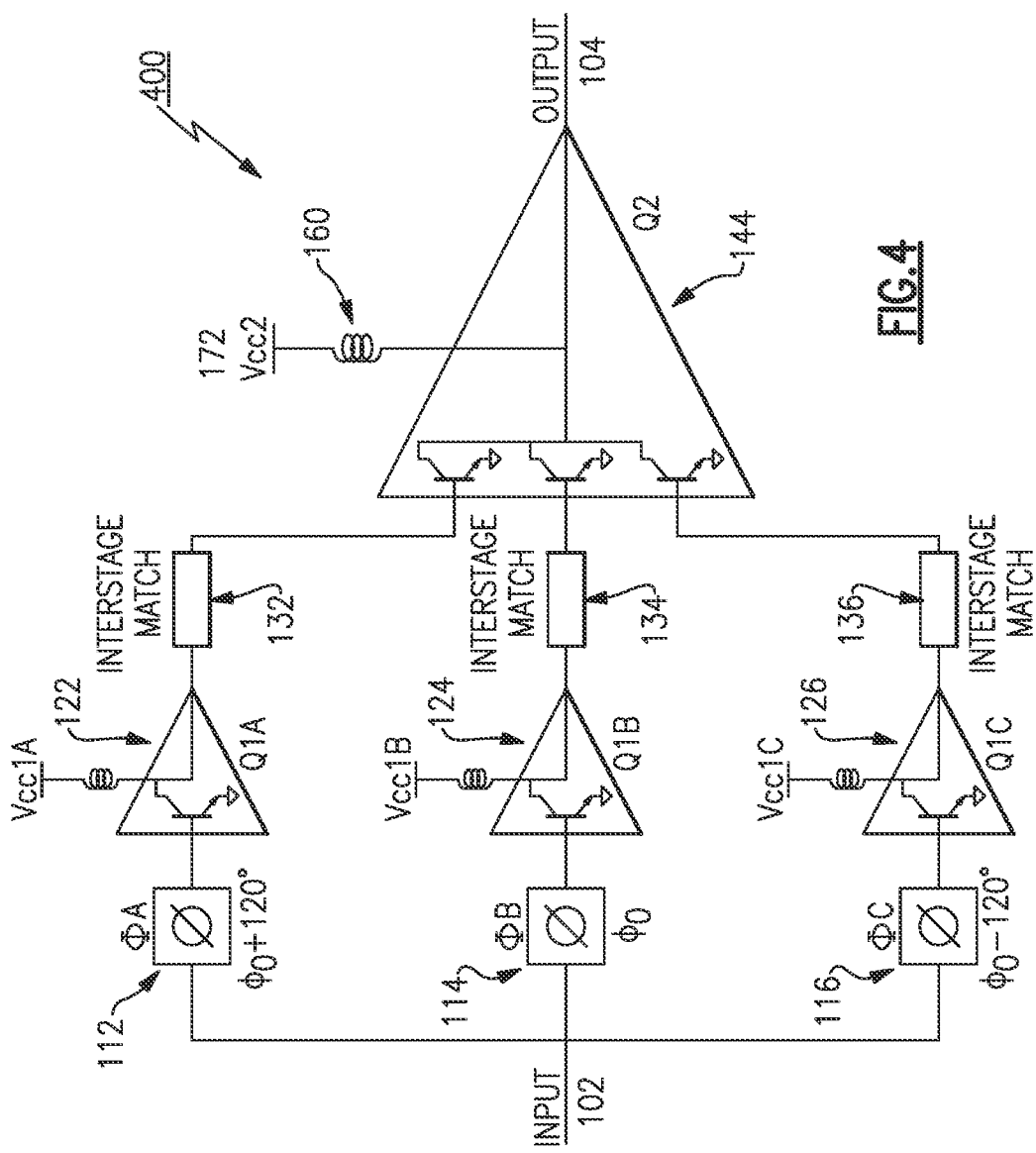
FIG. 4 is a block diagram of another example of an amplifier according to aspects of the present invention.

Referring to FIG. 4, there is illustrated another example of an amplifier 400 configured to provide phase control over a full dynamic range of 360°, according to certain embodiments. In this example, the amplifier 400 includes three circuit branches, each including a phase shifter (112, 114, 116, respectively), a first amplifier stage (122, 124, 126, respectively), and an interstage impedance matching network (132, 134, 136, respectively). As discussed above with reference to the amplifier 100 of FIG. 1, the elements in each circuit branch are the same, except that each phase shifter 112, 114, 116 has an individual phase shift value. As discussed above, the three branches are vectorially recombined at a second amplifier stage 144 (Q2), and the output signal is provided at the output contact 104. In this example, the second amplifier stage 144 includes a number of transistors 142 that is a multiple of three, connected in parallel at their collectors and emitters (or drains and sources if field effect transistors (FETs) are used). The summation of the three paths is accomplished by driving one of the bases (or gates) of the second amplifier stage 144 from each of three circuit branches. In one example, the full dynamic range of 360° in phase can be accomplished by configuring the three phase shifters 112, 114, 116 with phase shifts that are 120° apart (e.g. −120°, 0°, 120°). By independently controlling the collector voltages of the first amplifier stages 122, 124, 126 in all three branches (using independently programmable DC voltage sources 152, 154, 156, as discussed above), any desired output phase can be achieved.

Thus, aspects and embodiments provide tunable (i.e., controllable-output-phase) vector recombination amplifiers (i.e., output combining is done in the amplifier, without requiring a separate, potentially lossy, output-combining network) that are capable of broadband operation and useful in a wide variety of different power amplifier architectures. As discussed above, a desired output phase may be achieved and maintained by individually adjusting the voltages supplied by the first and second controllable DC voltage sources 152, 154. Accordingly, in certain embodiments, the amplifier 100 or 400 may be used in a feedback loop in combination with control circuitry. An example of such an implementation is shown in FIG. 5.

Figure 5:
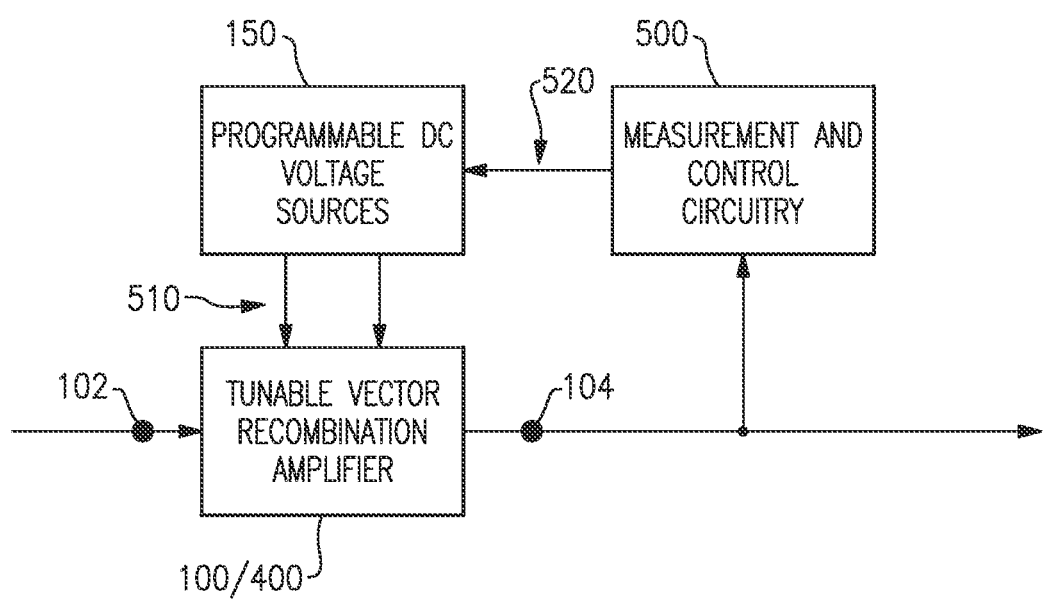
FIG. 5 is a block diagram showing one example of an amplifier in a feedback loop according to aspects of the present invention.

Referring to FIG. 5, a module or device, such as a power amplifier module, RF front-end module, or wireless device, for example, may include measurement and control circuitry 500 coupled to the amplifier 100/400 and to a bank of individually controllable DC voltage sources 150. The bank of individually controllable DC voltage sources 150 may include the first and second controllable DC voltage sources 152, 154 for embodiments of the amplifier 100, and also the third controllable DC voltage source 156 for embodiments of the amplifier 400, for example. In certain examples, additional controllable DC voltage sources may be included in the bank of individually controllable DC voltage sources 150 to power other components or additional amplifiers 100/400. Voltages are supplied from the bank of controllable DC voltage sources 150 to the amplifier 100/400 as indicated by arrows 510 and discussed above. The measurement and control circuitry 500 may receive or sample the output signal from the amplifier 100/400, and evaluate the signal to determine whether it has desired properties, such as the correct specified phase and/or amplitude. Based on the evaluation, the measurement and control circuitry 500 may apply a control signal 520 to adjust the voltages supplied by any of the controllable DC voltage sources in the bank of individually controllable DC voltage sources 150 to tune the characteristics of the output signal from the amplifier 100/400. In certain examples, the measurement and control circuitry 500 may include an electromagnetic coupler or other device to extract a portion of the output signal from the amplifier 100/400 for evaluation, along with sensors, such as a power detector or phase detector, for example. Thus, by monitoring the output signal from the amplifier 100/400, the measurement and control circuitry 500 may control the banks of individually controllable DC voltage sources 150 to maintain desired characteristics of the output signal over a wide frequency range and/or changing temperature or other conditions, or to alter the characteristics of the output signal to adjust to a different application or operation of the device in which the amplifier 100/400 is used.

Embodiments of the amplifier 100/400 may be advantageously used in a variety of electronic devices. For example, as discussed above, embodiments of the amplifier 100/400 may be used as or in a power amplifier, or as part of a power amplifier module, included in a variety of communications modules and devices, including RF front-end modules and wireless devices, for example.

Figure 6:
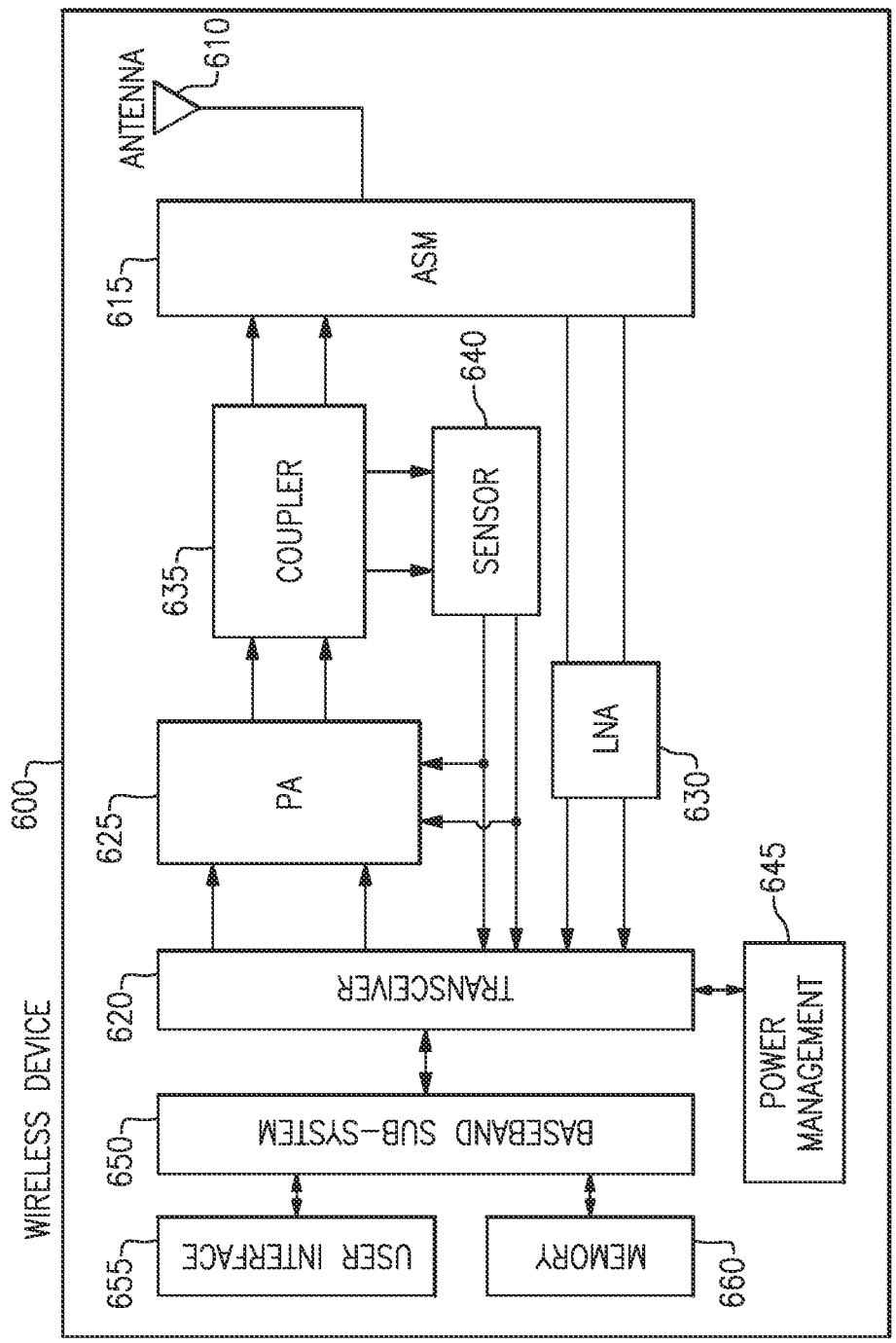
FIG. 6 is a block diagram of one example of a wireless device in which embodiments of the amplifiers according to aspects of the present invention may be used.

FIG. 6 is a block diagram of one example of a wireless device 600 in which embodiments of the amplifier 100/400 may be used. The wireless device 600 can be a cellular phone, smart phone, tablet, modem, communication network or any other portable or non-portable device configured for voice and/or data communication. The wireless device 600 can receive and transmit signals from the antenna 610. The wireless device 600 includes an antenna switch module 615 that can be used to switch between a transmitting mode and receiving mode of the wireless device 600, for example, between different transmit or receive frequency bands, or between different antennas (although only one antenna 610 is shown). The wireless device 600 further includes a transceiver 620 that is configured to generate signals for transmission and/or to process received signals. As shown in FIG. 6, in certain embodiments the antenna 610 both receives signals that are provided to the transceiver 620 via the antenna switch module 615 and also transmits signals from the wireless device 600. However, in other examples multiple antennas can be used.

Signals generated for transmission are received by a power amplifier (PA) module 625, which amplifies the generated signals from the transceiver 620. The receive path may include a low noise amplifier (LNA) 630 configured to amplify the received signals. The power amplifier module 625 can include one or more amplifiers 100/400 discussed above. The power amplifier module 625 can be used to amplify a wide variety of RF or other frequency-band transmission signals. For example, the power amplifier module 625 can receive an enable signal that can be used to pulse the output of the power amplifier to aid in transmitting a wireless local area network (WLAN) signal or any other suitable pulsed signal. The power amplifier module 625 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. As discussed above, the ability to tune the amplifier(s) 100/400 included in the power amplifier module 625 may allow the power amplifier module 625 to operate efficiently with any of these or other different signal types and communications protocols.

A directional coupler 635 can be used to extract a portion of the power from the RF signal traveling between the power amplifier module 625 and the antenna 610 and provide the coupled signal(s) to a sensor module 640. The sensor module 640 may send information to the transceiver 620 and/or directly to the power amplifier module 625 as feedback for making adjustments to regulate the output power level and/or phase characteristics of the signals output from the power amplifier module 625. In certain examples, the directional coupler 635 and sensor module 640 may form part of or be used in the measurement and control circuitry 500 discussed above. In certain embodiments in which the wireless device 600 is a mobile phone having a time division multiple access (TDMA) architecture, the directional coupler 635 can advantageously manage the amplification of an RF transmitted power signal from the power amplifier module 625. In a mobile phone having a time division multiple access (TDMA) architecture, such as those found in Global System for Mobile Communications (GSM), code division multiple access (CDMA), and wideband code division multiple access (W-CDMA) systems, the power amplifier module 625 can be used to shift power envelopes up and down within prescribed limits of power versus time. For instance, a particular mobile phone can be assigned a transmission time slot for a particular frequency channel. In this case the power amplifier module 625 can be employed to aid in regulating the power level one or more RF power signals over time, so as to prevent signal interference from transmission during an assigned receive time slot and to reduce power consumption. In such systems, the directional coupler 635 can be used to measure the power of a power amplifier output signal to aid in controlling the power amplifier module 625, as discussed above.

Still referring to FIG. 6, the wireless device 600 further includes a power management system 645 that is connected to the transceiver 620 and that manages the power for the operation of the wireless device 600. The power management system 645 can also control the operation of a baseband sub-system 650 and other components of the wireless device 600. The power management system 645 can include, or can be connected to, a battery (not shown) that supplies power for the various components of the wireless device 600. The power management system 645 can further include one or more processors or controllers that may provide control signals to configure operation of the various components of the wireless device 600, including the power amplifier module 625 and the directional coupler 635, for example. In certain embodiments, part of the measurement and control circuitry 500 may be implemented in the power management system 645.

In one embodiment, the baseband sub-system 650 is connected to a user interface 655 to facilitate various input and output of voice and/or data provided to and received from the user. The baseband sub-system 650 can also be connected to memory 660 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A tunable vector recombination amplifier comprising:
   an input;
   an output;
   a first amplifier circuit path including a first phase shifter, a first interstage impedance matching network, and a first amplifier connected between the first phase shifter and the first interstage impedance matching network, the first phase shifter being configured to receive an input signal from the input and to apply a first phase shift to produce a first phase-shifted signal, and the first amplifier being configured to receive and amplify the first phase-shifted signal to produce a first amplified signal;
   a second amplifier circuit path including a second phase shifter, a second interstage impedance matching network, and a second amplifier connected between the second phase shifter and the second interstage impedance matching network, the second phase shifter being configured to receive the input signal from the input and to apply a second phase shift, different from the first phase shift, to produce a second phase-shifted signal, and the second amplifier being configured to receive and amplify the second phase-shifted signal to produce a second amplified signal;

a first controllable DC voltage source coupled to the first amplifier and configured to provide a first supply voltage to the first amplifier;

a second controllable DC voltage source coupled to the second amplifier and configured to provide a second supply voltage to the second amplifier, values of the first and second supply voltages being independently controllable; and an output amplifier stage coupled to the first and second amplifier circuit paths and to the output and configured to receive, amplify, and vectorially combine the first and second amplified signals to produce a combined output signal having a specified phase and amplitude at the output, the specified phase being determined by the first and second phase shifts and the values of the first and second supply voltages.

2. The tunable vector recombination amplifier of claim 1 wherein the first phase shift is $\phi_0+\Delta\phi$ and the second phase shift is $\phi_0-\Delta\phi$, wherein $\phi_0$ is an average of the first and second phase shifts, and $2\Delta\phi$ is a phase difference between the first and second phase shifts.

3. The tunable vector recombination amplifier of claim 2 wherein the first phase shift is +45 degrees and the second phase shift is −45 degrees.

4. The tunable vector recombination amplifier of claim 2 wherein the output amplifier stage includes an even plurality of transistors connected in parallel, and wherein a first half of the even plurality of transistors receive the first amplified signal and a second half of the even plurality of transistors received the second amplified signal.

5. The tunable vector recombination amplifier of claim 4 wherein the transistors of the even plurality of transistors are bipolar junction transistors and are connected in parallel at their collectors and emitters.

6. The tunable vector recombination amplifier of claim 4 wherein the transistors of the even plurality of transistors are field effect transistors and are connected in parallel at their drains and sources.

7. The tunable vector recombination amplifier of claim 2 wherein each of the first amplifier and the second amplifier includes a plurality of transistors connected in parallel.

8. The tunable vector recombination amplifier of claim 1 further comprising:
a third amplifier circuit path including a third phase shifter, a third interstage impedance matching network, and a third amplifier connected between the third phase shifter and the third interstage impedance matching network, the third phase shifter being configured to receive the input signal from the input and to apply a third phase shift, different from the first and second phase shifts, to produce a third phase-shifted signal, and the third amplifier being configured to receive and amplify the third phase-shifted signal to produce a third amplified signal; and
a third controllable DC voltage source coupled to the third amplifier and configured to provide a third supply voltage to the third amplifier, a value of the third supply voltage being controllable independent of the first and second supply voltages,
wherein the output amplifier stage is further coupled to the third amplifier circuit path and configured to receive, amplify, and vectorially combine the first, second, and third amplified signals to produce the combined output signal, the specified phase of the output signal being determined by the first, second, and third phase shifts and the values of the first, second, and third supply voltages.

9. A tunable vector recombination amplifier comprising:
an input;
an output;
a plurality of amplifier circuit paths connected to the input, each including a first amplifier stage, a phase shifter connected to an input of the first amplifier stage, an interstage impedance matching network connected to an output of first amplifier stage, and a controllable DC voltage source connected to the first amplifier stage, each amplifier circuit path of the plurality of amplifier circuit paths configured to receive an input signal from the input and to provide a phase-shifted, amplified first-stage output signal; and
a second amplifier stage coupled to the plurality of amplifier circuit paths and to the output, the second amplifier stage being configured to receive, amplify, and vectorially combined the phase-shifted, amplified first-stage output signals from the plurality of amplifier circuit paths to produce a combined output signal having a specified phase and amplitude at the output, the specified phase being determined by phase shift values applied by the phase shifter in each of the plurality of amplifier circuit paths and individually controllable voltages applied to the first amplifier stage of each of the plurality of amplifier circuit paths by the controllable DC voltage sources.

10. The amplifier module of claim 9 further comprising a controller coupled to the output and to the controllable DC voltage sources, the controller being configured to receive and analyze the combined output signal and to adjust the individually controllable voltages applied to the first amplifier stage of each of the plurality of amplifier circuit paths by the controllable DC voltage sources to maintain the specified phase of the combined output signal.

11. A wireless device comprising:
a transceiver configured to produce a transmit signal; and
a power amplifier module including at least one tunable vector recombination amplifier and a plurality of individually controllable DC voltage sources, the at least one tunable vector recombination amplifier being configured to receive the transmit signal, to divide the transmit signal into at least two amplifier paths each having a different phase shift, and to amplify and vectorially recombine phase-shifted components of the transmit signal from each of the at least two amplifier paths to produce an amplified transmit signal having a specified phase and amplitude, each of the at least two amplifier paths of the at least one tunable vector recombination amplifier including a first-stage amplifier driven by one of the plurality of individually controllable DC voltage sources to tune the specified phase of the amplified transmit signal.

12. The wireless device of claim 11 wherein the at least two amplifier paths include:
a first amplifier path including a first phase shifter, a first interstage impedance matching network, and a first first-stage amplifier connected between the first phase shifter and the first interstage impedance matching network, the first phase shifter being configured to receive the transmit signal and to apply a first phase shift to produce a first phase-shifted signal, and the first first-stage amplifier being configured to receive and amplify the first phase-shifted signal to produce a first amplified signal; and a second amplifier path including a second phase shifter, a second interstage impedance matching network, and a second first-stage amplifier connected between the second phase shifter and the second interstage impedance matching network, the second phase shifter being configured to receive the transmit signal and to apply a second phase shift, different from the first phase shift, to produce a second phase-shifted signal, and the second amplifier being configured to receive and amplify the second phase-shifted signal to produce a second amplified signal.

13. The wireless device of claim 12 wherein the plurality of individually controllable DC voltage sources includes:
a first controllable DC voltage source coupled to the first first-stage amplifier and configured to provide a first supply voltage to the first amplifier; and
a second controllable DC voltage source coupled to the second first-stage amplifier and configured to provide a second supply voltage to the second amplifier, values of the first and second supply voltages being independently controllable.

14. The wireless device of claim 13 wherein the at least one tunable vector recombination amplifier includes an output amplifier stage coupled to the first and second amplifier paths and configured to receive, amplify, and vectorially combine the first and second amplified signals to produce the amplified transmit signal having the specified phase and amplitude, the specified phase being determined by the first and second phase shifts and the values of the first and second supply voltages.

15. The wireless device of claim 14 wherein the first phase shift is $\phi_0+\Delta\phi$ and the second phase shift is $\phi_0-\Delta\phi$, wherein $\phi_0$ is an average of the first and second phase shifts, and $2\Delta\phi$ is a phase difference between the first and second phase shifts.

16. The wireless device of claim 14 wherein the first phase shift is +45 degrees and the second phase shift is −45 degrees.

17. The wireless device of claim 14 wherein the output amplifier stage includes an even plurality of transistors connected in parallel, and wherein a first half of the even plurality of transistors receive the first amplified signal and a second half of the even plurality of transistors received the second amplified signal.

18. The wireless device of claim 14 further comprising:
an electromagnetic coupler configured to receive the amplified transmit signal and to sample the amplified transmit signal via electromagnetic coupling to produce a coupled signal having characteristics representative of the amplified transmit signal.

19. The wireless device of claim 18 further comprising:
a sensor module coupled to the power amplifier module and to the electromagnetic coupler, the sensor module being configured to receive and analyze the coupled signal, and to adjust the values of the first and second supply voltages to tune the specified phase of the amplified transmit signal.

20. The wireless device of claim 18 further comprising:
sensor module coupled to the electromagnetic coupler and configured to receive the coupled signal and to provide sensor information representative of at least one of the characteristics of the amplified transmit signal; and
control circuitry coupled to the power amplifier module and to the sensor module, the control circuitry being configured to receive the sensor information and to adjust the values of the first and second supply voltages, based on the sensor information, to tune the specified phase of the amplified transmit signal.

* * * * *